(12) United States Patent
Anderson et al.

(10) Patent No.: US 10,170,463 B2
(45) Date of Patent: Jan. 1, 2019

(54) BIPOLAR TRANSISTOR COMPATIBLE WITH VERTICAL FET FABRICATION

(71) Applicant: INTERNATIONAL BUSINESS MACHINES CORPORATION, Armonk, NY (US)

(72) Inventors: Brent A. Anderson, Jericho, VT (US); Kangguo Cheng, Schenectady, NY (US); Terence B. Hook, Jericho, VT (US); Tak H. Ning, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/596,376

(22) Filed: May 16, 2017

(65) Prior Publication Data
US 2018/0090380 A1    Mar. 29, 2018

Related U.S. Application Data

(63) Continuation of application No. 15/280,068, filed on Sep. 29, 2016, now Pat. No. 9,859,172.

(51) Int. Cl.
*H01L 23/31* (2006.01)
*H01L 27/06* (2006.01)
(Continued)

(52) U.S. Cl.
CPC ...... *H01L 27/0623* (2013.01); *H01L 21/8249* (2013.01); *H01L 23/3171* (2013.01); *H01L 27/0635* (2013.01); *H01L 29/0649* (2013.01); *H01L 29/1004* (2013.01); *H01L 29/1037* (2013.01); *H01L 29/66272* (2013.01); *H01L 29/66287* (2013.01); *H01L 29/66666* (2013.01); *H01L 29/732* (2013.01);
(Continued)

(58) Field of Classification Search
CPC ............ H01L 21/8249; H01L 27/0623; H01L 29/66272; H01L 29/666666
See application file for complete search history.

(56) References Cited

U.S. PATENT DOCUMENTS

| 5,581,101 A | 12/1996 | Ning et al. |
| 6,686,604 B2 | 2/2004 | Layman et al. |

(Continued)

FOREIGN PATENT DOCUMENTS

JP    2011211037    10/2011

OTHER PUBLICATIONS

Richter et al., "Damage to Si substrates during SiO, etching: Opportunities of subsequent removal by optimized cleaning procedures", Vacuum, vol. 47 No. 5, pp. 437-443, 1996.*
(Continued)

*Primary Examiner* — Yu Chen
*Assistant Examiner* — Vincent Wall
(74) *Attorney, Agent, or Firm* — Tutunjian & Bitetto, P.C.; Vazken Alexanian

(57) ABSTRACT

Methods of forming integrated chips include forming a gate stack around a first semiconductor fin and a second semiconductor fin. The gate stack around the second semiconductor fin is etched away. An extrinsic base is formed around the second semiconductor fin in a region exposed by etching away the gate stack.

16 Claims, 7 Drawing Sheets

(51) Int. Cl.
*H01L 29/06* (2006.01)
*H01L 29/08* (2006.01)
*H01L 29/10* (2006.01)
*H01L 29/66* (2006.01)
*H01L 29/78* (2006.01)
*H01L 29/423* (2006.01)
*H01L 29/732* (2006.01)
*H01L 21/8249* (2006.01)

(52) U.S. Cl.
CPC ...... *H01L 29/7827* (2013.01); *H01L 29/0804* (2013.01); *H01L 29/0821* (2013.01); *H01L 29/0847* (2013.01); *H01L 29/42356* (2013.01)

(56) References Cited

U.S. PATENT DOCUMENTS

| | | |
|---|---|---|
| 6,849,871 B2 | 2/2005 | Ning |
| 6,903,411 B1 | 6/2005 | Chyan et al. |
| 7,056,783 B2 | 6/2006 | Layman et al. |
| 7,064,417 B2 | 6/2006 | Arai |
| 7,271,046 B2 | 9/2007 | Arai |
| 7,701,015 B2 | 4/2010 | He et al. |
| 2007/0181959 A1* | 8/2007 | Park ................. H01L 29/42392 257/401 |
| 2014/0077296 A1* | 3/2014 | Yamashita ...... H01L 21/823431 257/347 |
| 2015/0102348 A1* | 4/2015 | Cai ....................... H01L 29/785 257/69 |
| 2015/0348844 A1* | 12/2015 | Brightsky ........... H01L 21/8222 257/5 |

OTHER PUBLICATIONS

Tak H. Ning, "A Perspective on SOI Symmetric Lateral Bipolar Transistors for Ultra-Low-Power Systems," in IEEE Journal of the Electron Devices Society, vol. 4, No. 5, pp. 227-235, Sep. 2016.

Jin Cai, "Complementary thin-base symmetric lateral bipolar transistors on SOI," Electron Devices Meeting (IEDM), 2011 IEEE International, Washington, DC, Dec. 2011.

List of IBM Patents or Patent Applications Treated as Related dated May 16, 2017, 2 pages.

* cited by examiner

BIPOLAR TRANSISTOR COMPATIBLE WITH VERTICAL FET FABRICATION

BACKGROUND

Technical Field

The present invention generally relates to semiconductor device fabrication and, more particularly, to vertical bipolar transistor fabrication processes that are compatible with vertical field effect transistor fabrication processes.

Description of the Related Art

Bipolar transistors use both electrons and holes as charge carriers, whereas unipolar transistors, such as field effect transistors, use either electrons or holes. Both forms of transistor can be fabricated in semiconductor integrated circuits. However, the fabrication of the devices in a vertical orientation, particularly when both varieties of transistor are formed in a shared fabrication process, poses particular challenges.

SUMMARY

A method of forming two transistors includes forming a gate stack around a first semiconductor fin and a second semiconductor fin. The gate stack around the second semiconductor fin is etched away. An extrinsic base is formed around the second semiconductor fin in a region exposed by etching away the gate stack.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide bipolar transistors and field effect transistors (FETs) on the same chip with compatible fabrication processes. This decreases the number of fabrication steps needed to create chips that include both varieties of device and, thus, decreases the cost of making the chips.

The structural differences between the FETs and the bipolar transistors of the present embodiments is that the source and drain regions of the FETs overlap with the gate, as this has advantageous effects for FETs, whereas the emitter and collector regions of the bipolar transistors do not overlap with the extrinsic base. In addition, instead of using a gate metal—gate dielectric stack, the bipolar transistors use a doped semiconductor extrinsic base terminal.

Figure 1:
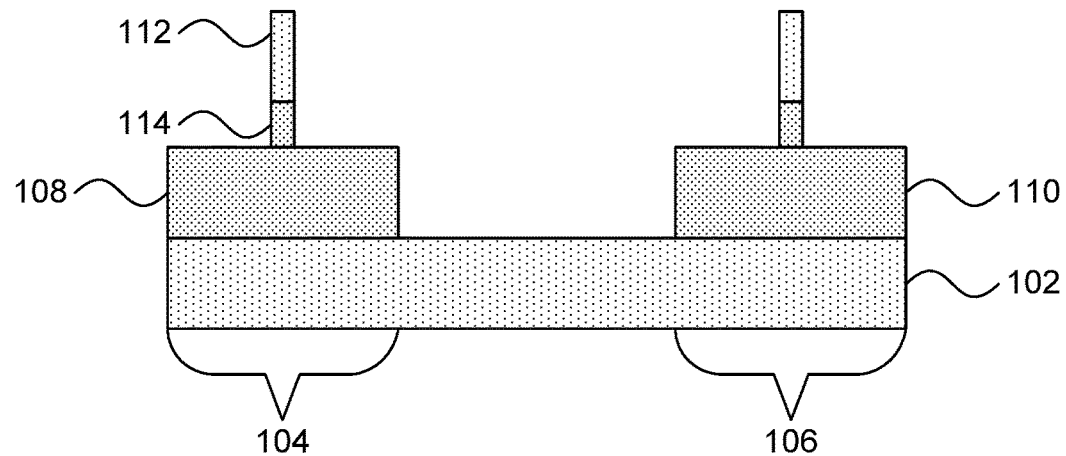
FIG. 1 is a cross-sectional diagram of a step in the formation of a chip having a field effect transistor (FET) and a bipolar transistor in accordance with the present embodiments.

Referring now to the drawings in which like numerals represent the same or similar elements and initially to FIG. 1, a cross-sectional view of a step in the formation of FETs with bipolar transistors is shown. A semiconductor substrate 102 is shown. The semiconductor substrate 102 may be a bulk-semiconductor substrate. In one example, the bulk-semiconductor substrate may be a silicon-containing material. Illustrative examples of silicon-containing materials suitable for the bulk-semiconductor substrate 102 include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride and zinc selenide. Furthermore, although not depicted in FIG. 1, the semiconductor substrate 102 may also be a semiconductor on insulator (SOI) substrate.

A FET region 104 and a bipolar region 106 are established on the semiconductor substrate 102. It should be understood that the present figures focus specifically on the active regions, with details regarding the structure of the device peripheries being omitted. Each region has a doped terminal. A source terminal 108 is formed in the FET region and a collector terminal 110 is formed in the bipolar region. The source and collector terminals 108/110 may be formed from doped semiconductor material that is formed on the semiconductor substrate 102 and subsequently etched to confine the terminals to their respective regions.

It is specifically contemplated that the source terminal 108 and collector terminal 110 may be formed from silicon, but any appropriate semiconductor material may be used instead. In one specific embodiment, where an n-type FET and an NPN bipolar transistor are being fabricated, the source terminal 108 and the collector 110 may be n-doped. In an alternative embodiment, where a p-type FET and a PNP bipolar transistor are being fabricated, the source terminal 108 and the collector 110 may be p-doped. As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor in a silicon containing substrate examples of n-type dopants, i.e., impurities, include but are not limited to antimony, arsenic and phosphorous.

Respective semiconductor fins 112 are formed on each of the source terminal 108 and the collector 110. Each fin 112 includes a doped portion 114 that has the same dopant type as the underlying layer. The doped portion 114 may be doped through diffusion from the underlying layer. The fins 112 may be formed by any appropriate lithographic process including, e.g., a photolithographic mask and etch. A pattern is produced by applying a photoresist to the surface of the semiconductor. The photoresist is exposed to a pattern of radiation that causes a chemical reaction within the photoresist. The pattern is then developed into the photoresist utilizing a resist developer. Once the patterning of the photoresist is completed, the sections covered by the photoresist are protected while the exposed regions are removed using a selective etching process that removes the unprotected regions. The photoresist may also be removed after patterning is complete. In one embodiment, a hardmask may be used to form the semiconductor fins 112. The mask may be formed by first depositing a dielectric hardmask material, like silicon nitride or silicon dioxide atop a layer of semiconductor layer and then applying a photoresist pattern to the hardmask material using a lithography process. The photoresist pattern is then transferred into the hardmask material using a dry etch process. Next the photoresist pattern is removed and the pattern is transferred into the semiconductor material during a selective etching process, such as reactive ion etching (RIE). The remaining mask material may be removed by a wet or dry etch.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the semiconductor fins 112 can be formed by other patterning techniques such as spacer image transfer.

Figure 2:
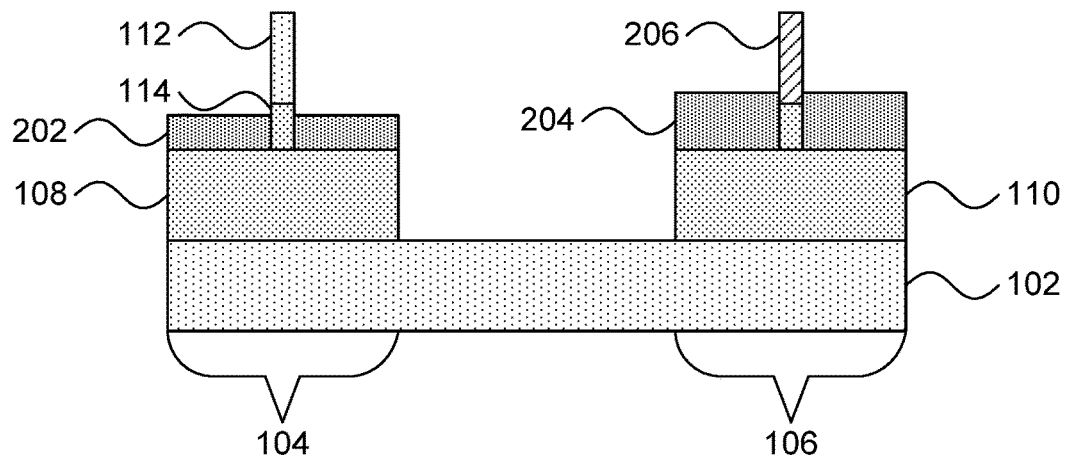
FIG. 2 is a cross-sectional diagram of a step in the formation of a chip having a FET and a bipolar transistor in accordance with the present embodiments.

Referring now to FIG. 2, a cross-sectional view of a step in the formation of FETs with bipolar transistors is shown. Spacers 202 and 204 are formed around the fins 112. A first spacer 202, located in the FET region 104, is formed with a height less than a height of the dopant 114 of the fin 112 in the FET region 104. A second spacer, located in the bipolar region 106, is formed with a height greater than a height of the dopant 114 of the fin 112 in the bipolar region 106. The different heights of the spacers 202 and 204 may be achieved by, e.g., depositing a dielectric material and then etching the dielectric material back in one or both regions to the appropriate height. It is specifically contemplated that the spacers 202 and 204 may be formed from silicon nitride, but it should be understood that any other insulating, dielectric, or hardmask material may be used instead.

At this point, the fin in the bipolar region 106 may be doped with a dopant type opposite that of the collector 110. Only the exposed region 206 will be doped, with some dopant diffusing down past the level of the spacer 204. Following the example above, the exposed region 206 may be doped with a p-type dopant at a concentration of about $10^{19}/cm^3$.

Figure 3:
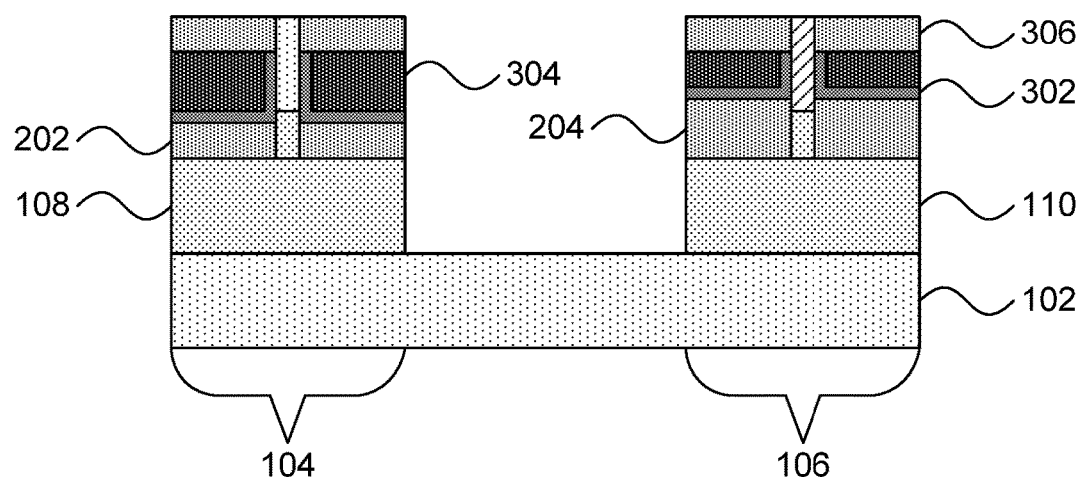
FIG. 3 is a cross-sectional diagram of a step in the formation of a chip having a FET and a bipolar transistor in accordance with the present embodiments.

Referring now to FIG. 3, a cross-sectional view of a step in the formation of FETs with bipolar transistors is shown. Gate stacks are formed in regions 104 and 106 with a gate dielectric layer 302 and a gate 304. As noted above, the figure shows only the active region of the device, so the lateral edges of the gate 304 and gate dielectric 302 are not shown. A layer of gate dielectric material is conformally deposited over the fins 112, with spacers 202 and 204 defining a position of the gate dielectric relative to doped regions 114. The gates 304 are then deposited over the gate dielectric layers 302.

The gates 304 and gate dielectric layers 302 are recessed down relative to the height of the fins 112. Spacer dielectric material is deposited over the gates 304 and then polished down to the level of the top of the fins 112 using, e.g., chemical mechanical planarization (CMP) to form top spacers 306.

The gate dielectric 302 is a layer of insulating or dielectric material such as, e.g., silicon dioxide or a high-k dielectric material (defined as having a dielectric constant k that is greater than that of silicon dioxide) such as hafnium dioxide, zirconium dioxide, aluminum oxide, titanium dioxide, lanthanum oxide, strontium titanium oxide, lanthanum aluminum oxide, yttrium oxide, hafnium silicate, hafnium silicon oxynitride, and mixtures thereof. The gate 304 is a conductive structure that may be formed from any appropriate metallic or conductive semiconductor material. Examples of materials suitable for the gate 304 include, but are not limited to, tungsten, nickel, titanium, molybdenum, tantalum, copper, platinum, silver, gold, ruthenium, iridium, rhenium, rhodium, alloys thereof, polysilicon, doped silicon, polysilicon-germanium alloys, and others.

CMP is performed using, e.g., a chemical or granular slurry and mechanical force to gradually remove upper layers of the device. The slurry may be formulated to be unable to dissolve, for example, the semiconductor material of fins 112, resulting in the CMP process's inability to proceed any farther than that layer.

Figure 4:
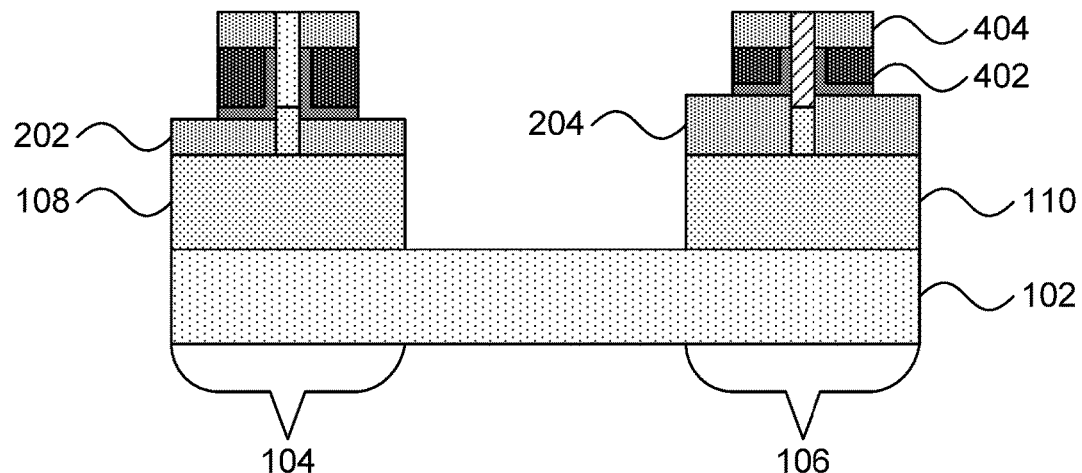
FIG. 4 is a cross-sectional diagram of a step in the formation of a chip having a FET and a bipolar transistor in accordance with the present embodiments.

Referring now to FIG. 4, a cross-sectional view of a step in the formation of FETs with bipolar transistors is shown. The top spacer 306, the gate 304, and the gate dielectric 302 are patterned to form patterned top spacer 404 and patterned gate stack 402. These structures may be formed lithographically using, e.g., a photomask and anisotropic etching.

Figure 5:
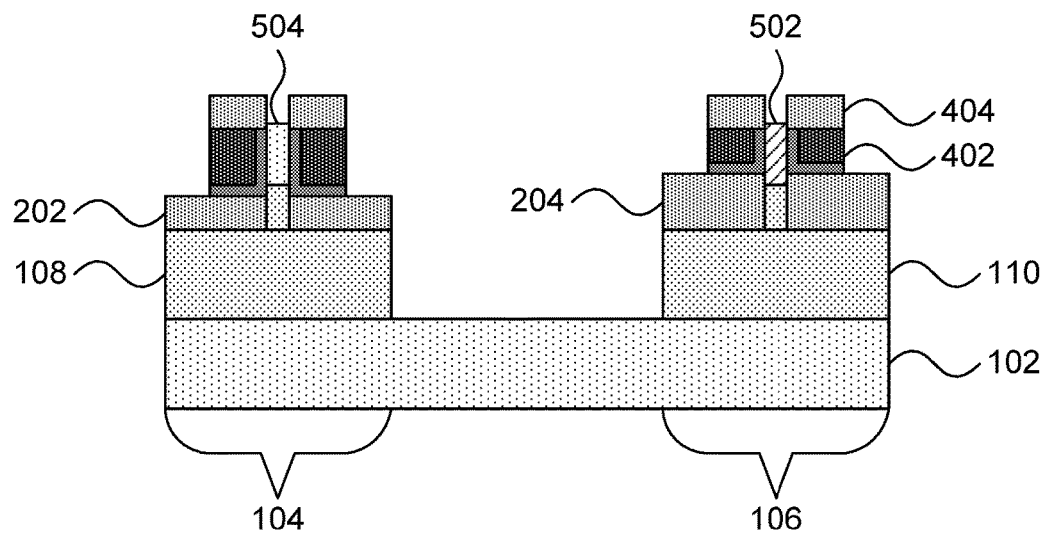
FIG. 5 is a cross-sectional diagram of a step in the formation of a chip having a FET and a bipolar transistor in accordance with the present embodiments.

Referring now to FIG. 5, a cross-sectional view of a step in the formation of FETs with bipolar transistors is shown. The fins 112 are recessed, forming recessed undoped FET fin 504 and recessed doped bipolar fin 502. The fin recess may be accomplished by, e.g., a timed chemical etch that leaves the heights of the fins above a height of the patterned gate stacks 402.

Figure 6:
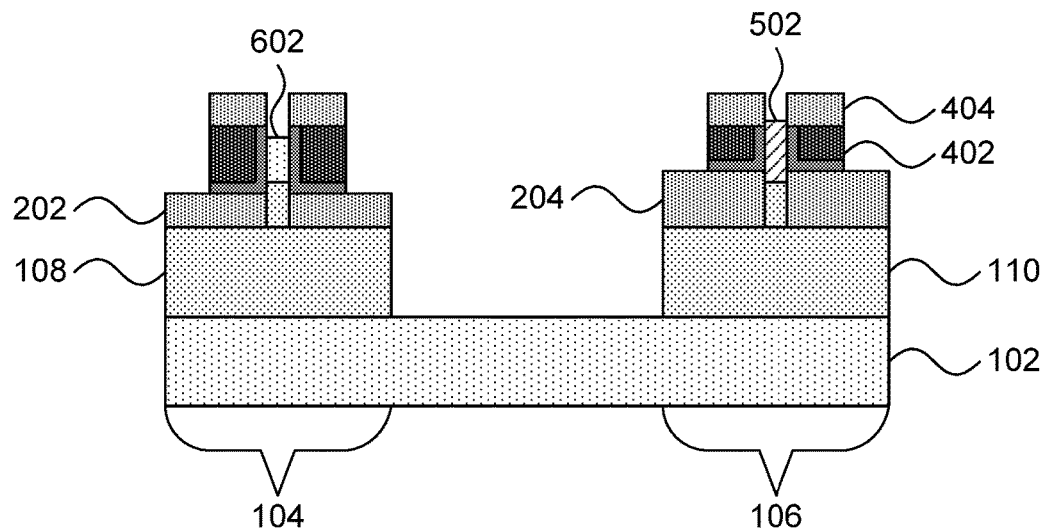
FIG. 6 is a cross-sectional diagram of a step in the formation of a chip having a FET and a bipolar transistor in accordance with the present embodiments.

Referring now to FIG. 6, a cross-sectional view of a step in the formation of FETs with bipolar transistors is shown. The FET fin 504 is further recessed using any appropriate etch to form FET fin 602, which has a height lower than that of the top level of the patterned gate stack 402. The recessed doped bipolar fin 502 is masked during this etch, such that its height remains above the height of the gate stacks 402.

Figure 7:
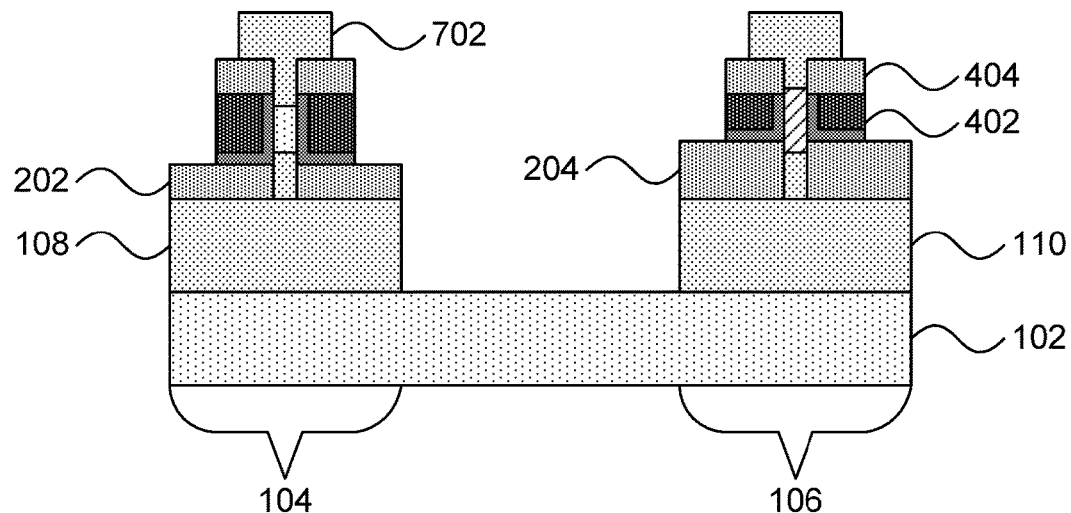
FIG. 7 is a cross-sectional diagram of a step in the formation of a chip having a FET and a bipolar transistor in accordance with the present embodiments.

Referring now to FIG. 7, a cross-sectional view of a step in the formation of FETs with bipolar transistors is shown. Fin extensions 702 are epitaxially grown from the recessed fins 502 and 602. The fin extensions 702 are doped with the same dopant type as the source and collector terminals 108/110 and may be doped in situ or by dopant implantation.

Figure 8:
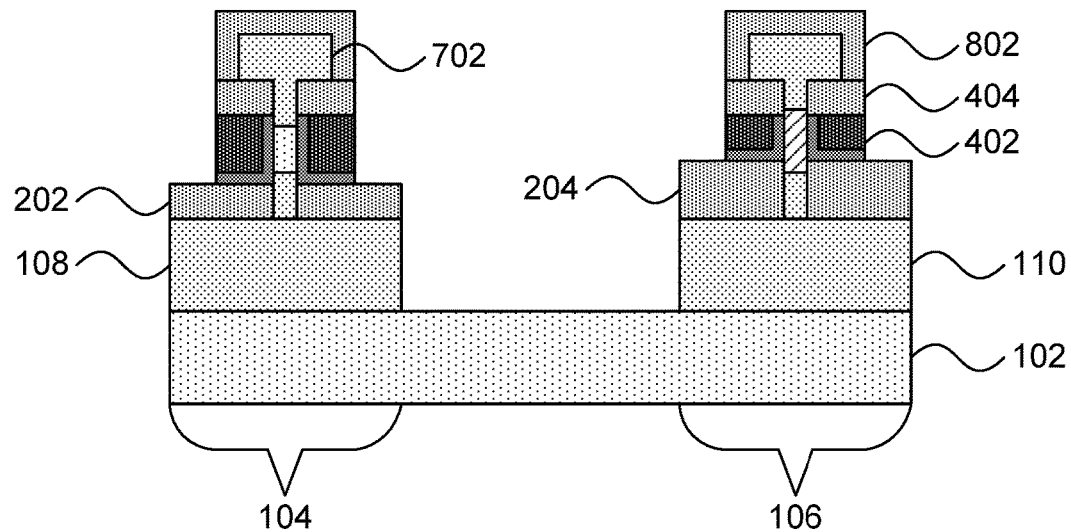
FIG. 8 is a cross-sectional diagram of a step in the formation of a chip having a FET and a bipolar transistor in accordance with the present embodiments.

Referring now to FIG. 8, a cross-sectional view of a step in the formation of FETs with bipolar transistors is shown. An encapsulation layer 802 is formed over the fin extensions 702 by, e.g., plasma nitridation. The encapsulation layer 802 protects the underling fin extensions 702 from subsequent epitaxial growth processes.

Figure 9:
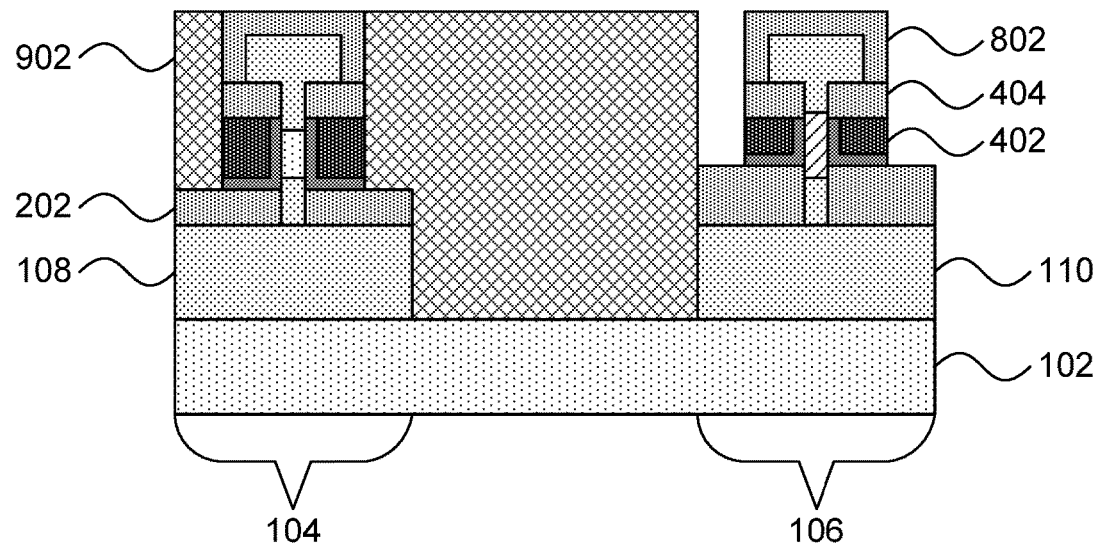
FIG. 9 is a cross-sectional diagram of a step in the formation of a chip having a FET and a bipolar transistor in accordance with the present embodiments.

Referring now to FIG. 9, a cross-sectional view of a step in the formation of FETs with bipolar transistors is shown. A layer of passivating dielectric material is deposited over both regions 104 and 106 and subsequently etched away over the bipolar region 106 to form dielectric layer 902.

Figure 10:
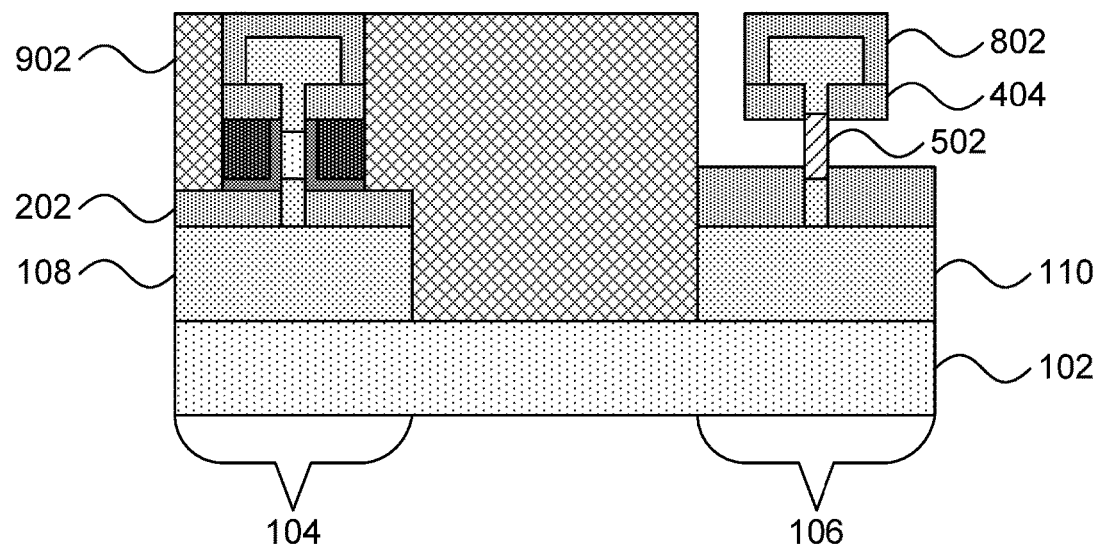
FIG. 10 is a cross-sectional diagram of a step in the formation of a chip having a FET and a bipolar transistor in accordance with the present embodiments.

Referring now to FIG. 10, a cross-sectional view of a step in the formation of FETs with bipolar transistors is shown. The gate stack 402 in the bipolar region 106 is etched away, leaving the sides of the doped bipolar fin 502 exposed. The etch may be any appropriate wet or dry isotropic etch that selectively removes the materials of the gate stack 402 without affecting the spacers or the semiconductor fin.

Figure 11:
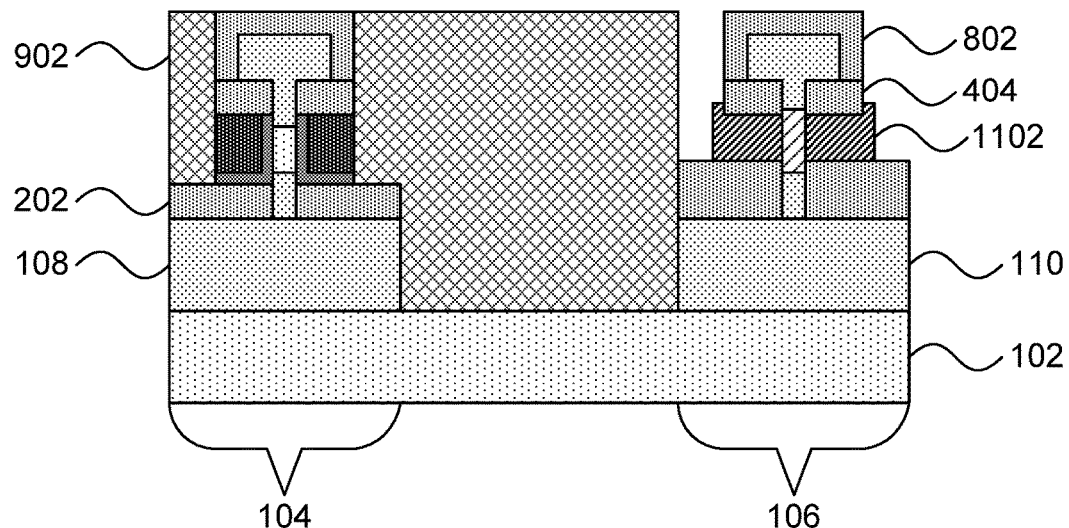
FIG. 11 is a cross-sectional diagram of a step in the formation of a chip having a FET and a bipolar transistor in accordance with the present embodiments.

Referring now to FIG. 11, a cross-sectional view of a step in the formation of FETs with bipolar transistors is shown. An extrinsic base 1102 is epitaxially grown from the sidewalls of the doped bipolar fin 502. The extrinsic base 1102 may be formed from, e.g., a doped semiconductor using the same semiconductor material as the semiconductor fins 112. The dopant of the extrinsic base 1102 may be the same dopant as is used in the doped bipolar fin 502, and it is specifically contemplated that the dopant will be added in situ during epitaxial growth. The presence of the encapsulating layer 1002 protects the fin extension 702 in the bipolar region 106 from being affected by the growth of the extrinsic base 1102.

Figure 12:
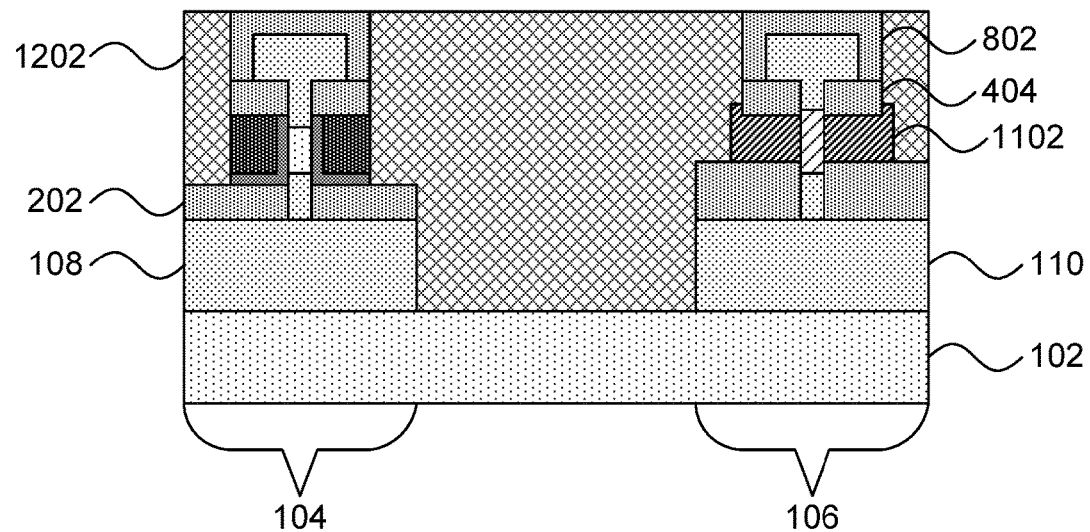
FIG. 12 is a cross-sectional diagram of a step in the formation of a chip having a FET and a bipolar transistor; in accordance with the present embodiments

Referring now to FIG. 12, a cross-sectional view of a step in the formation of FETs with bipolar transistors is shown. Passivating dielectric material is filled into the bipolar region, completing passivating layer 1202. Electrical contacts can now be formed to the devices, through the passivating layer 1202, by etching holes in the passivating layer 1202 and depositing conductive contact material.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another elements) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 13:
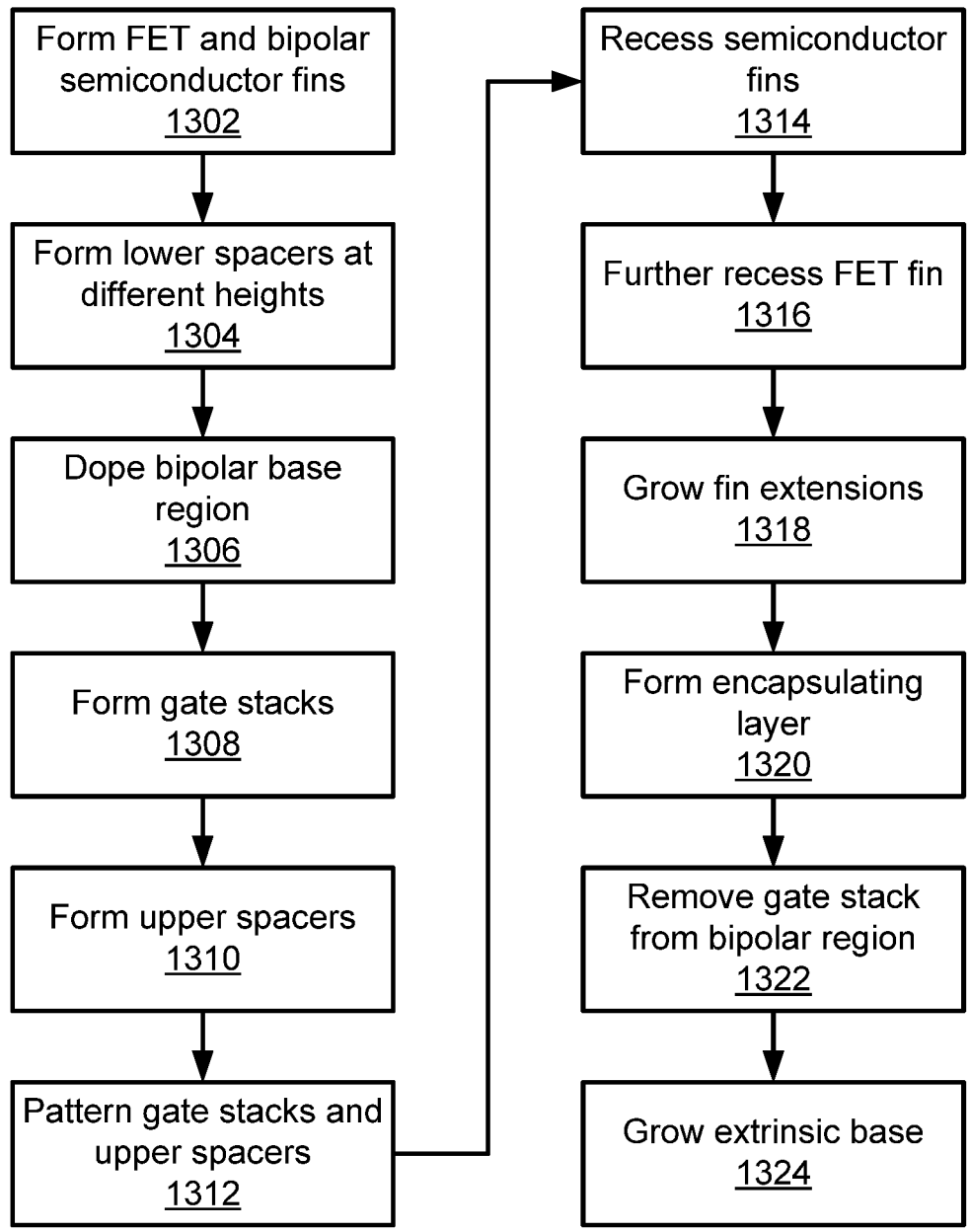
FIG. 13 is a block/flow diagram of a method of forming a chip having a FET and a bipolar transistor in accordance with the present embodiments.

Referring now to FIG. 13, a method of forming FETs and bipolar transistors on a single chip is shown. Block 1302 forms semiconductor fins 112 in a FET region 104 and a bipolar region 106 on a respective source terminal 108 and collector terminal 110. Block 1304 forms lower spacers 202 and 204 in the respective FET region 104 and bipolar region 106, with the FET lower spacer 202 having a height below a height of dopant in the semiconductor fin 112 in the FET region 104 and with the bipolar lower spacer 204 having a height above a height of dopant in the semiconductor fin 112 in the bipolar region 106. Block 1306 dopes the base region 206 of the semiconductor fin 112 in the bipolar region 106.

Block 1308 forms gate stacks 302/304 on the lower spacers 202 and 204 and block 1310 forms upper spacers 306 over the gate stacks. Block 1312 patterns the gate stacks and the upper spacers 306 to form patterned gate stacks 402 and patterned upper spacers 404 in both the FET region 104 and the bipolar region 106.

Block 1314 recesses the semiconductor fins 112 in both the FET region 104 and the bipolar region 106, followed by a further recess of the semiconductor fin 112 in the FET region by block 1316. Block 1318 grows fin extensions 702 from the exposed tops of the recessed semiconductor fins and block 1320 forms an encapsulating layer over the fin extensions 702.

Block 1322 then removes the gate stack 402 from around the base region of the semiconductor fin in the bipolar region 106, with the FET region being protected by a dielectric layer. Block 1324 grows an extrinsic base 1102 from the fin 502. A passivating layer 1202 may then be formed around the devices and electrical contact can be made.

Having described preferred embodiments of a bipolar transistor compatible with vertical FET fabrication (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating two transistors, comprising:
    forming a first semiconductor fin and a second semiconductor fin, where each of the first and second semiconductor fins comprises a doped lower portion;
    forming lower spacers around the first and second semiconductor fins, the lower spacer around the first semiconductor fin having a height lower than a height of the lower spacer around the second semiconductor fin;
    forming a gate stack around the first semiconductor fin and the second semiconductor fin;
    wherein the height of the lower spacer around the first semiconductor fin rises below a level of the doped lower portion of the first semiconductor fin and wherein the height of the lower spacer around the second semiconductor fin rises above a level of the doped lower portion of the second semiconductor fin;
    forming an upper spacer around the first and second semiconductor fin and over the gate stacks;
    etching away the gate stack around the second semiconductor fin; and
    forming an extrinsic base around the second semiconductor fin and under the upper spacer in a region exposed by etching away the gate stack.

2. The method of claim 1, further comprising recessing the first and second semiconductor fins below a height of the gate stack after forming the upper spacer.

3. The method of claim 2, further comprising:
    masking the second semiconductor fin after recessing the first and second semiconductor fins; and
    recessing the first semiconductor fin below a height of the second semiconductor fin.

4. The method of claim 1, wherein the gate stack around the first semiconductor fin extends vertically above and below a channel region of the first semiconductor fin.

5. The method of claim 1, wherein the extrinsic base has upper and lower limits that are within a respective upper and lower limit of a base region of the second semiconductor fin.

6. The method of claim 1, wherein the first and second semiconductor fins are vertical semiconductor fins.

7. The method of claim 1, wherein forming the first semiconductor fin and second semiconductor fin comprises doping the doped lower portion by diffusion from an underlying doped layer.

8. A method for fabricating two transistors, comprising:
    forming a first semiconductor fin and a second semiconductor fin, each comprising a doped lower portion;
    forming lower spacers around the first and second semiconductor fins, the lower spacer around the first semiconductor fin having a height lower than a level of the doped lower portions and the lower spacer around the second semiconductor fin having a height above a level of the doped lower portions;
    forming a gate stack around the first semiconductor fin and the second semiconductor fin;

etching away the gate stack around the second semiconductor fin; and forming an extrinsic base around the second semiconductor fin in a region exposed by etching away the gate stack.

9. The method of claim 8, further comprising forming an upper spacer around the first and second semiconductor fin and over the gate stacks.

10. The method of claim 8, further comprising recessing the first and second semiconductor fins below a height of the gate stack after forming the upper spacer.

11. The method of claim 10, further comprising:
masking the second semiconductor fin after recessing the first and second semiconductor fins; and
recessing the first semiconductor fin below a height of the second semiconductor fin.

12. The method of claim 8, wherein the gate stack around the first semiconductor fin extends vertically above and below a channel region of the first semiconductor fin.

13. The method of claim 8, wherein the extrinsic base has upper and lower limits that are within a respective upper and lower limit of a base region of the second semiconductor fin.

14. The method of claim 8, wherein the first and second semiconductor fins are vertical semiconductor fins.

15. The method of claim 8, wherein forming the first semiconductor fin and second semiconductor fin comprises doping the doped lower portion by diffusion from an underlying doped layer.

16. A method for fabricating two transistors, comprising:
forming a first semiconductor fin and a second semiconductor fin;
doping a doped lower portion of each of the first semiconductor fin and the second semiconductor fin by diffusion from an underlying doped layer;
forming lower spacers around the first and second semiconductor fins, the lower spacer around the first semiconductor fin having a height lower than a height of the lower spacer around the second semiconductor fin;
forming a gate stack around the first semiconductor fin and the second semiconductor fin;
forming an upper spacer around the first and second semiconductor fin and over the gate stacks;
etching away the gate stack around the second semiconductor fin; and
forming an extrinsic base around the second semiconductor fin and under the upper spacer in a region exposed by etching away the gate stack.

* * * * *